United States Patent [19]
Noble

[11] Patent Number: 5,977,579
[45] Date of Patent: Nov. 2, 1999

[54] TRENCH DRAM CELL WITH VERTICAL DEVICE AND BURIED WORD LINES

[75] Inventor: Wendell P. Noble, Milton, Vt.

[73] Assignee: Micron Technology, Inc., Boise, Id.

[21] Appl. No.: 09/204,072

[22] Filed: Dec. 3, 1998

[51] Int. Cl.$^6$ .................................................. H01L 29/72
[52] U.S. Cl. ......................... 257/302; 257/296; 257/301; 257/304; 257/311; 257/618
[58] Field of Search .................................. 257/296, 301, 257/302, 304, 311, 618

[56] References Cited

U.S. PATENT DOCUMENTS

| | | |
|---|---|---|
| 5,001,526 | 3/1991 | Gotou . |
| 5,252,845 | 10/1993 | Kim et al. . |
| 5,334,548 | 8/1994 | Shen et al. . |
| 5,497,017 | 3/1996 | Gonzales ................................ 257/302 |
| 5,504,357 | 4/1996 | Kim et al . |
| 5,753,947 | 5/1998 | Gonzalez . |

OTHER PUBLICATIONS

W.F. Richardson et al, "A Trench Transistor Cross–Point Dram Cell", 1985 IEEE, pp. 714–717, Jan.

Hyun–Jin Cho et al, "A Novel Pillar Dram Cell for 4Gbit And Beyond", 1998 symposium on VLSI Technology Digest of Technical Papers, pp. 38–39, Jan.

C.J. Radens et al., "A 0.21$\mu$m$^2$7F$^2$Trench Cell with a Locally–Open Globally–Folded Dual Bitline for 1Gb/4Gb Dram", 1998 Symposium on VLSI Technology Digest of Technical Papers, pp. 36–37. Jan.

*Primary Examiner*—Edward Wojciechowicz
*Attorney, Agent, or Firm*—Dickstein Shapiro Morin & Oshinsky LLP

[57] ABSTRACT

A DRAM array having trench capacitor cells of potentially 4F$^2$ surface area (F being the photolithographic minimum feature width), and a process for fabricating such an arrays. The array has a cross-point cell layout in which a memory cell is located at the intersection of each bit line and each word line. Each cell in the array has a vertical device such as a transistor, with the source, drain, and channel regions of the transistor being formed from epitaxially grown single crystal silicon. The vertical transistor is formed above the trench capacitor.

42 Claims, 14 Drawing Sheets

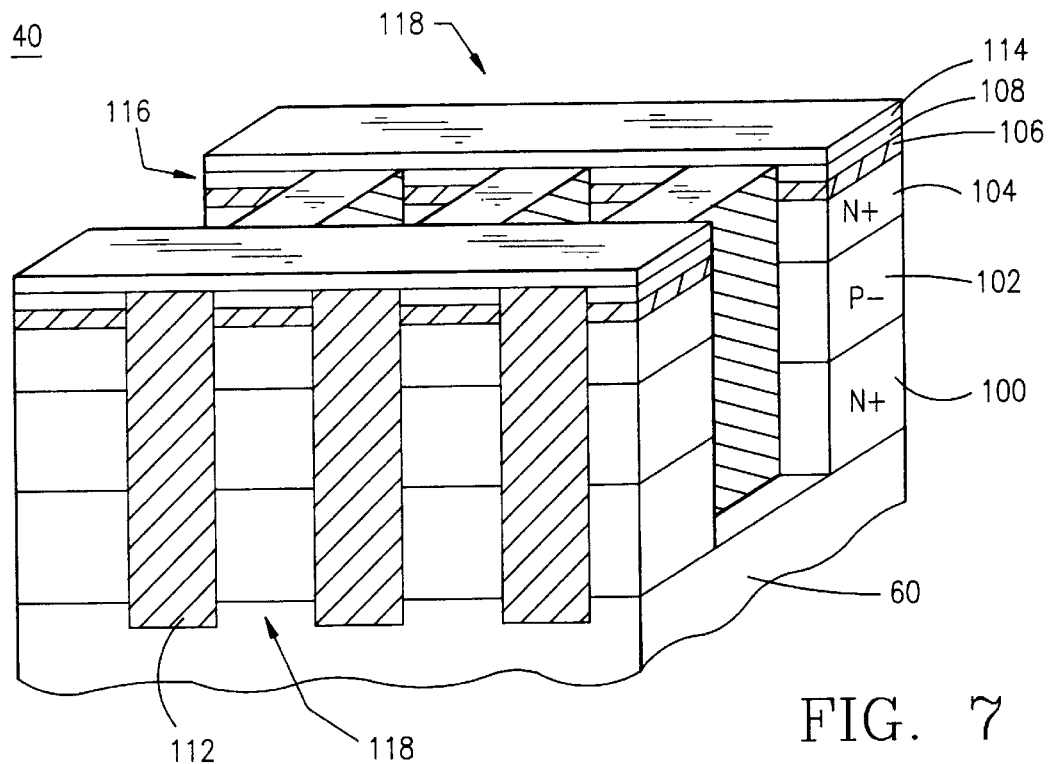
FIG. 7
FIG. 8
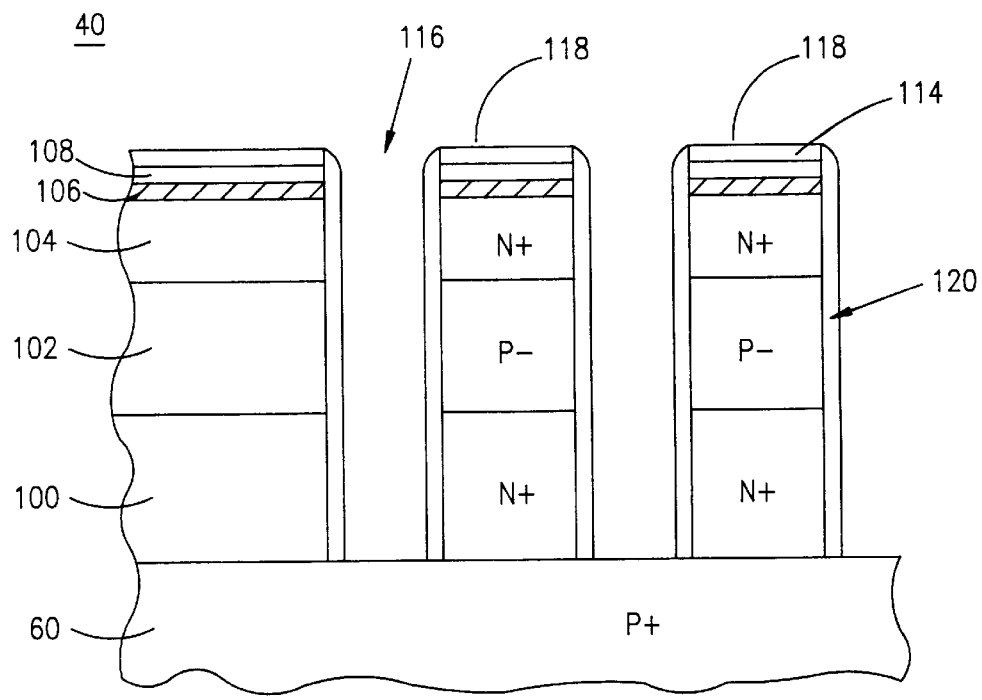

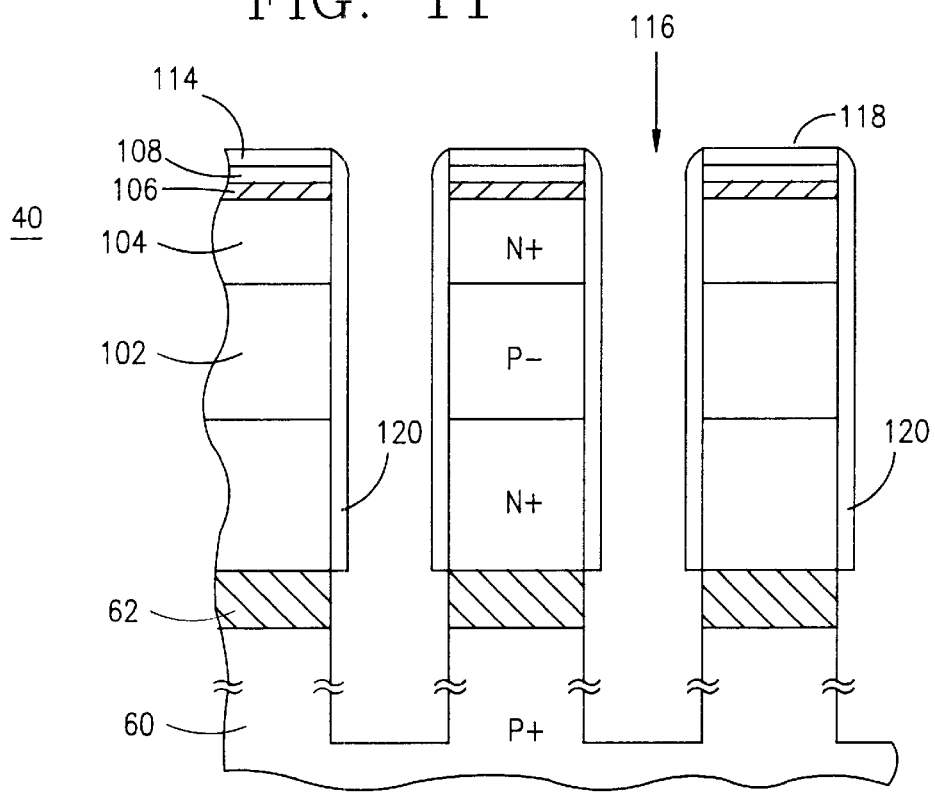
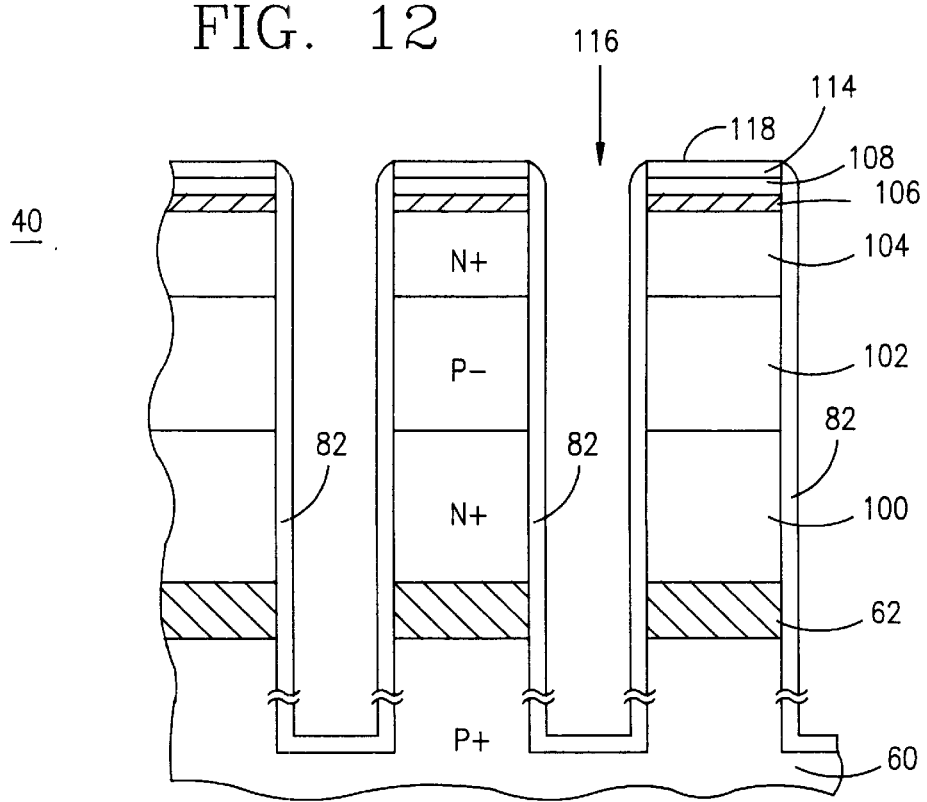

TRENCH DRAM CELL WITH VERTICAL DEVICE AND BURIED WORD LINES

FIELD OF THE INVENTION

The present invention relates generally to an improved semiconductor structure for high density device arrays, and in particular to a trench DRAM cell array, and to a process for its formation.

BACKGROUND OF THE INVENTION

There are two major types of random-access memory cells, dynamic and static. Dynamic random-access memories (DRAMs) can be programmed to store a voltage which represents one of two binary values, but require periodic reprogramming or "refreshing" to maintain this voltage for more than very short time periods. Static random-access memories are so named because they do not require periodic refreshing.

DRAM memory circuits are manufactured by replicating millions of identical circuit elements, known as DRAM cells, on a single semiconductor wafer. Each DRAM cell is an addressable location that can store one bit (binary digit) of data. In its most common form, a DRAM cell consists of two circuit components: a field effect transistor (FET) and a capacitor.

FIG. 1 illustrates a portion of a DRAM memory circuit containing two neighboring DRAM cells 42. For each cell, the capacitor 44 has two connections, located on opposite sides of the capacitor 44. The first connection is to a reference voltage, which is typically one half of the internal operating voltage (the voltage corresponding to a logical "1" signal) of the circuit. The second connection is to the drain of the FET 46. The gate of the FET 46 is connected to the word line 48, and the source of the FET is connected to the bit line 50. This connection enables the word line 48 to control access to the capacitor 44 by allowing or preventing a signal (a logical "0" or a logical "1") on the bit line 50 to be written to or read from the capacitor 44.

The body of the FET 46 is connected to the body line 76, which is used to apply a fixed potential to the body. In a present day conventional bulk silicon DRAM, this connection is provided directly to the silicon bulk in which the array devices are formed. However, in SOI or other oxide isolated devices, a separate means of body connection is needed to maintain the body potential. Body lines are used to avoid floating body threshold voltage instabilities that occur when FETs are used on silicon-on-insulator (SOI) substrates. These threshold voltage instabilities occur because the body of the FET does not have a fixed potential. Threshold voltage is a function of the potential difference between the source and the body of a FET, so if the body does not have a fixed potential, then the threshold voltage will be unstable. Because control of the threshold voltage is especially critical in DRAM cells, a body line may be used to provide the body of the FET with a fixed potential so that the threshold voltage of the FET may thereby be stabilized.

The manufacturing of a DRAM cell includes the fabrication of a transistor, a capacitor, and three contacts: one each to the bit line, the word line, and the reference voltage. DRAM manufacturing is a highly competitive business. There is continuous pressure to decrease the size of individual cells and to increase memory cell density to allow more memory to be squeezed onto a single memory chip, especially for densities greater than 256 Megabits. Limitations on cell size reduction include the passage of both active and passive word lines through the cell, the size of the cell capacitor, and the compatibility of array devices with non-array devices.

Conventional folded bit line cells of the 256 Mbit generation with planar devices have a size of at least $8F^2$, where F is the minimum lithographic feature size. If a folded bit line is not used, the cell may be reduced to 6 or 7 $F^2$. To achieve a smaller size, vertical devices must be used. Cell sizes of $4F^2$ may be achieved by using vertical transistors stacked either below or above the cell capacitors, as in the "cross-point cell" of W. F. Richardson et al., "A Trench Transistor Cross-Point DRAM Cell," IEDM Technical Digest, pp. 714–17 (1985). Known cross-point cells, which have a memory cell located at the intersection of each bit line and each word line, are expensive and difficult to fabricate because the structure of the array devices is typically incompatible with that of non-array devices. Other known vertical cell DRAMs using stacked capacitors have integration problems due to the extreme topography of the capacitors.

There is needed, therefore, a DRAM cell having an area of $4F^2$ or smaller that achieves high array density while maintaining structural commonality between array and peripheral (non-array) features. Also needed is a simple method of fabricating a trench DRAM cell that maximizes common process steps during the formation of array and peripheral devices.

SUMMARY OF THE INVENTION

The present invention provides a DRAM cell array having a cell area of $4F^2$ or smaller which comprises an array of vertical transistors located over an array of trench capacitors. The trench capacitor for each cell is located beneath and to one side of the vertical transistor, thereby decreasing the cell area while maintaining compatibility of the vertical transistors with peripheral devices. Also provided is a simplified process for fabricating the DRAM cell array which may share common process steps with peripheral device formation so as to minimize the fabrication cost of the array.

Additional advantages and features of the present invention will be apparent from the following detailed description and drawings which illustrate preferred embodiments of the invention.

BRIEF DESCRIPTION OF THE DRAWINGS

FIG. 7 shows the wafer of FIG. 3 at a processing step subsequent to that shown in FIG. 6.

FIG. 8 shows the wafer of FIG. 3 at a processing step subsequent to that shown in FIG. 7.

FIG. 11 shows the wafer of FIG. 3 at a processing step subsequent to that shown in FIG. 10.

FIG. 12 shows the wafer of FIG. 3 at a processing step subsequent to that shown in FIG. 11.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide. The following detailed description is, therefore, not to be taken in a limiting sense, and the scope of the present invention is defined by the appended claims.

Figure 1:
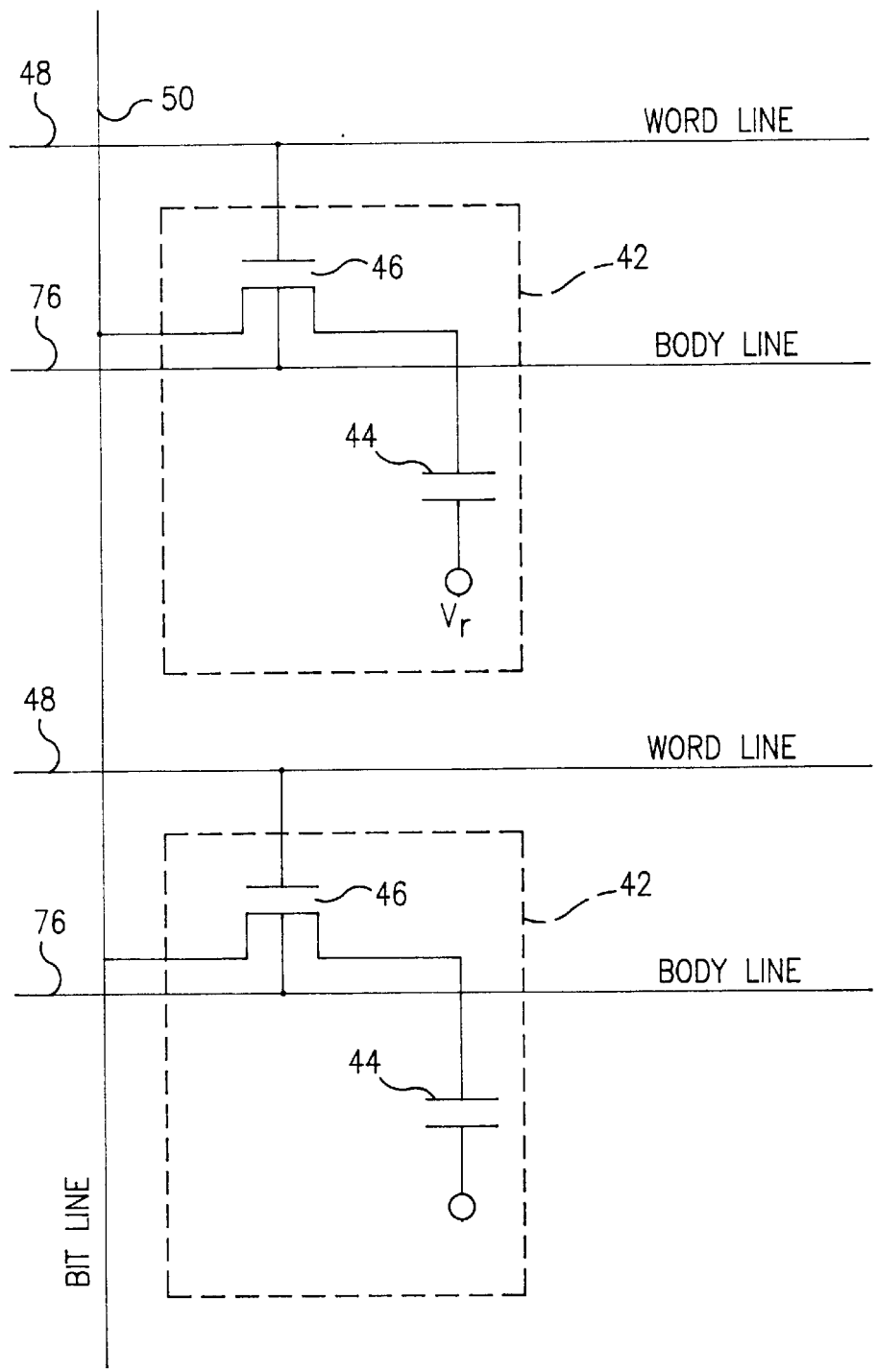
FIG. 1 is a schematic illustration of a known DRAM cell.
Figure 2:
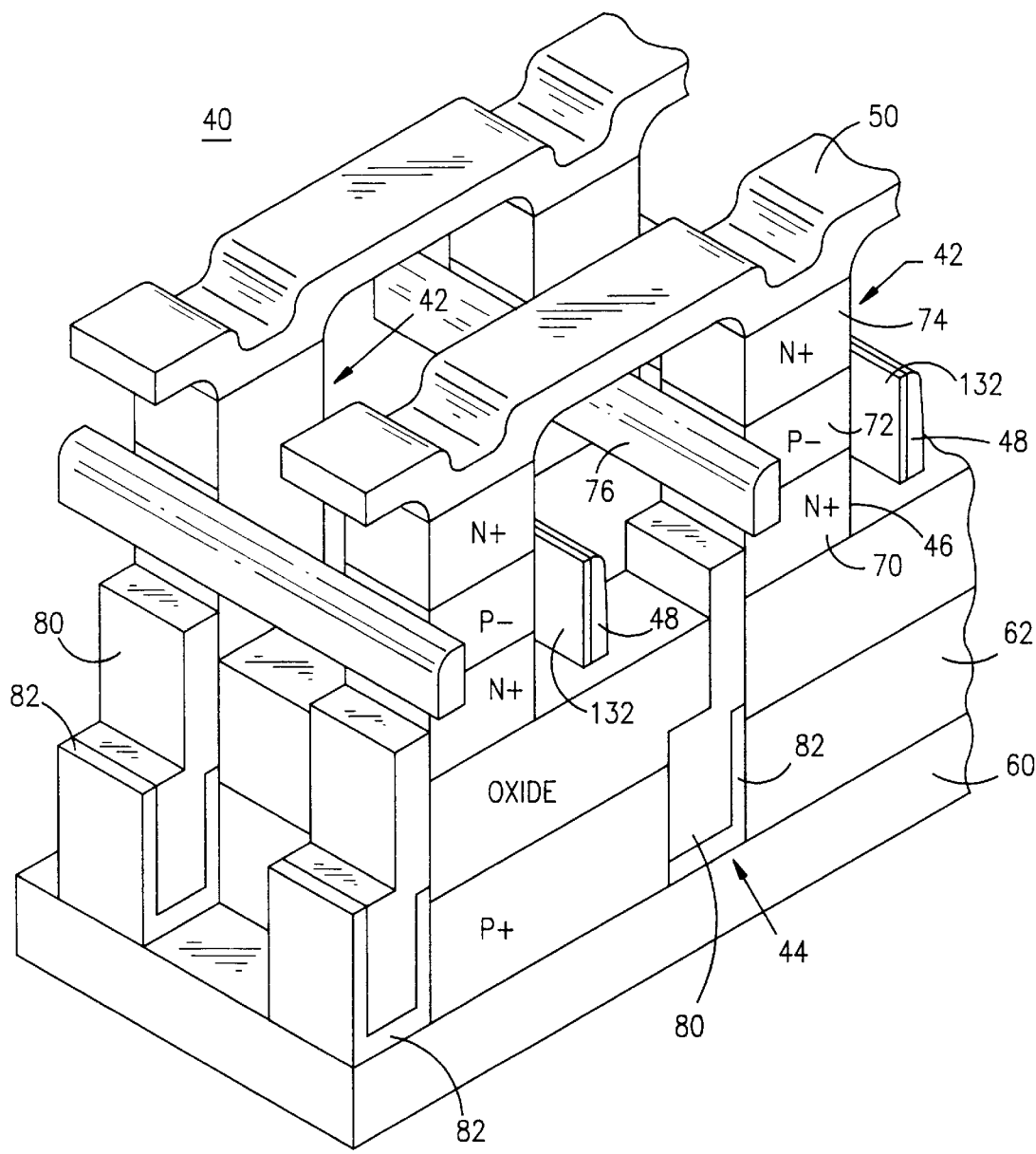
FIG. 2 is a perspective view of the memory array of the present invention.

Referring now to the drawings, where like elements are designated by like reference numerals, an embodiment of the device array 40 of the present invention is shown in FIG. 2. The device array 40 is comprised of a plurality of trench DRAM cells 42 formed on a substrate 60, where the DRAM cells 42 are separated from each other by oxide isolation layers 62. Each DRAM cell 42 comprises two components, a vertical transistor 46, and a trench capacitor 44 located beneath the transistor 46.

The transistor 46 forms a vertical stack of three doped silicon layers resting on top of the isolation layer 62. An exemplary n-channel device, as illustrated in FIG. 2, would be formed using a substrate 60 of a first conductivity type, e.g., p+, a drain 70 of a second conductivity type (n+), a lightly-doped body region 72 of a first conductivity type (p−), and a source 74 of a second conductivity type (n+). If a p-channel device were desired, the doping types and levels of these elements would be adjusted as is known in the art. The capacitor 44 comprises a polysilicon electrode 80, which for exemplary purposes is of a second conductivity type (n+), and a dielectric 82, which may be any suitable dielectric material such as oxide, ON (oxide-nitride), or ONO (oxide-nitri-deoxide). The region of the substrate 60 underlying the electrode 80 acts as a capacitor plate.

The transistor 46 is a MOSFET (metal-oxide-semiconductor FET) device having four contacts to other portions of the cell 42 or array 40. First, the drain 70 of the transistor 46 is in contact with the capacitor electrode 80. Second, a conductive bit line 50 formed of polysilicon doped to a second conductivity type (n+) is formed so that it contacts the source 74 of each transistor 46 of a particular column in th e array 40. Third, an active word line 48 of a conductive material such as doped polysilicon of a second conductivity type (n+) is formed to act as the gate of each transistor 46, and to electrically connect all of the cells 42 of a given row in the array 40. A thin oxide layer 132 is present between the word line 48 and the body 72 of each transistor 46. Fourth, a body line 76 of a conductive material such as doped polysilicon of a first conductivity type (p+) is formed to contact the body 72 of each transistor 46 in a given row. The presence of the body line 76 serves to avoid floating body threshold voltage instabilities.

The device array 40 is manufactured through a process described as following, and illustrated by FIGS. 3 through 25. For exemplary purposes, dimensions are suggested which are suitable for 0.2 micron critical dimension technology, and it should be understood that dimensions should be scaled accordingly for other critical dimension sizes. First, a substrate 60, which may be an y of the types of substrate described above, is selected as the base for the device array 40. For exemplary purposes, the substrate 60 will be described as a silicon substrate, and the following process should be modified as appropriate and as known in the art if a non-silicon substrate is used. The substrate 60 may be doped or undoped, but a p+type doped wafer is preferred. If PMOS devices are to be formed, photolithography is used to define areas where n-wells (not shown) are implanted. The level of doping in the n-wells may vary but should be of comparable or greater strength than the doping level of the substrate 60.

Figure 3:
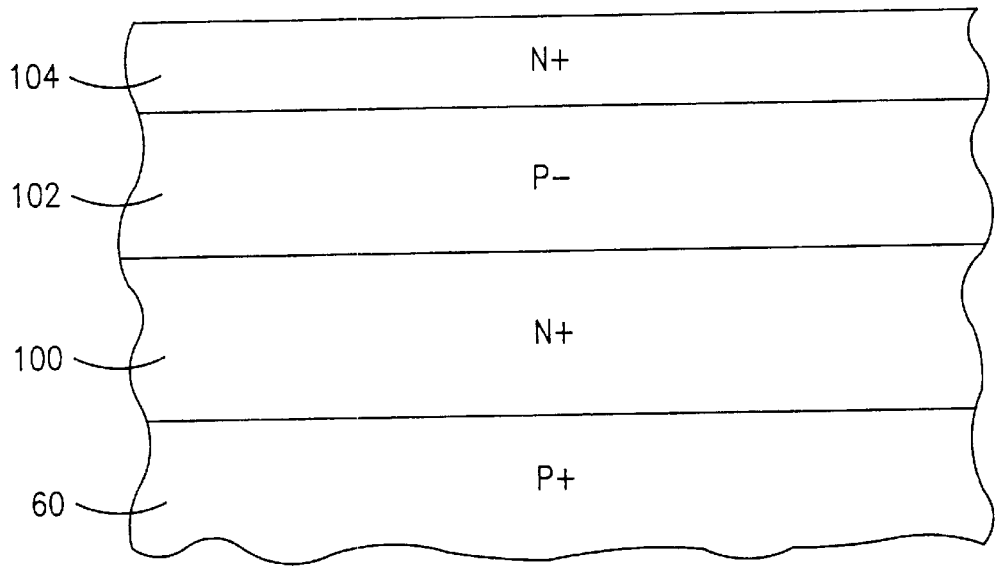
FIG. 3 is a cross-sectional view of a semiconductor wafer undergoing the process of a preferred embodiment.

As shown in FIG. 3, the first step in the process is to form the device layers 100, 102, 104. The device layers 100, 102, 104 are formed of doped epitaxial silicon by known methods of epitaxial growth, such as vapor phase, liquid phase, or solid phase epitaxy. If a silicon substrate 60 is used, then vapor phase epitaxy is preferred, and if a Group III-V compound substrate, e.g., gallium arsenide or indium phosphate, is used, liquid phase epitaxy is preferred. For the formation of the device array 40 of the present embodiment, the first device layer 100 should be a doped silicon layer of a second conductivity type (n+) approximately 0.4 microns thick, the second device layer 102 should be a lightly-doped silicon layer of a first conductivity type (p−) approximately 0.35 microns thick, and the third device layer 104 should be a doped silicon layer of a second conductivity type (n+) approximately 0.2 microns thick.

Figure 4:
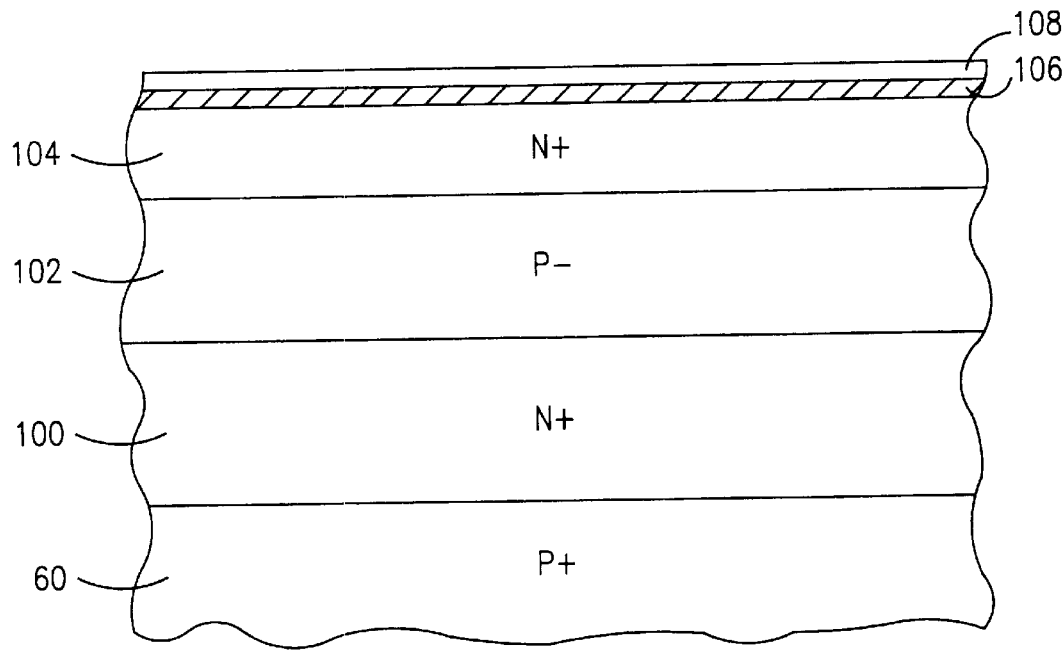
FIG. 4 shows the wafer of FIG. 3 at a processing step subsequent to that shown in FIG. 3.
Figure 5:
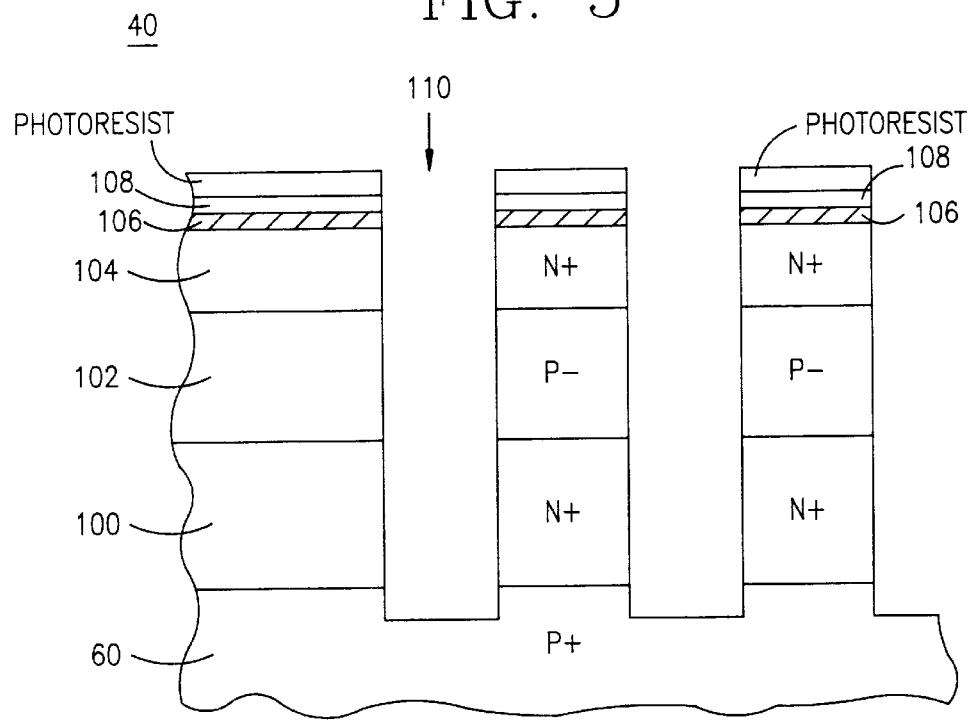
FIG. 5 shows the wafer of FIG. 3 at a processing step subsequent to that shown in FIG. 4.

Next, as shown in FIG. 4, an oxide pad 106 approximately 10 nm thick, and a first nitride pad 108 approximately 100 nm thick are formed on top of the third device layer 104 by chemical vapor deposition (CVD) or other suitable means. A photoresist and mask are then applied over the first nitride pad 108, and photolithographic techniques are used to define a set of parallel columns on the array surface. A directional etching process such as plasma etching or reactive ion etching (RIE) is used to etch through the pad layers 106, 108 and the device layers 100, 102, 104 and into the substrate 60 to form a first set of trenches 110, as depicted in FIG. 5. The trenches 110 should be approximately 1.05 microns deep.

Figure 6:
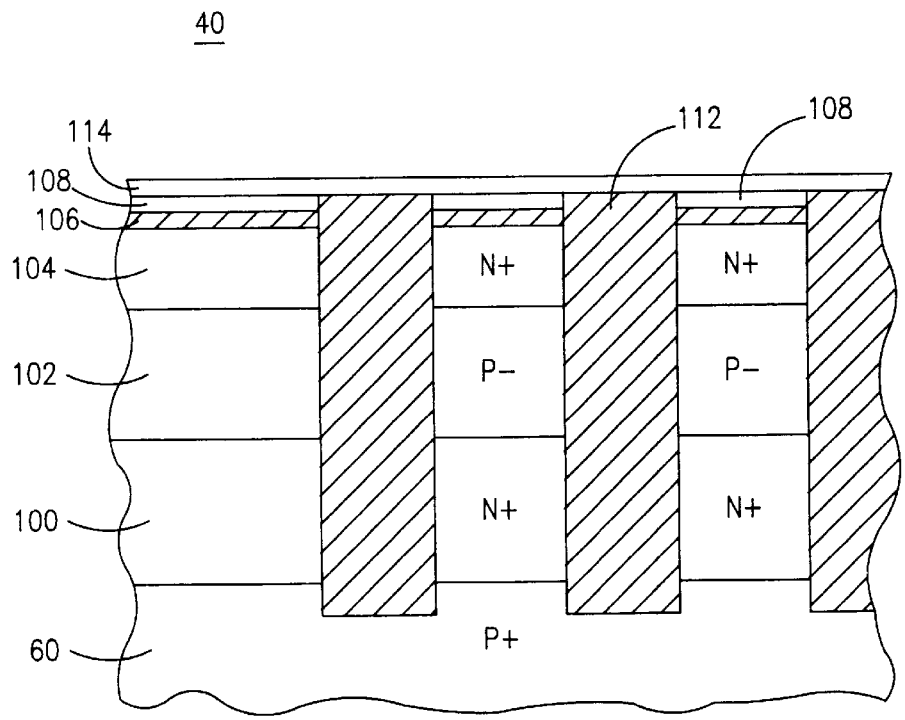
FIG. 6 shows the wafer of FIG. 3 at a processing step subsequent to that shown in FIG. 5.
Figure 9:
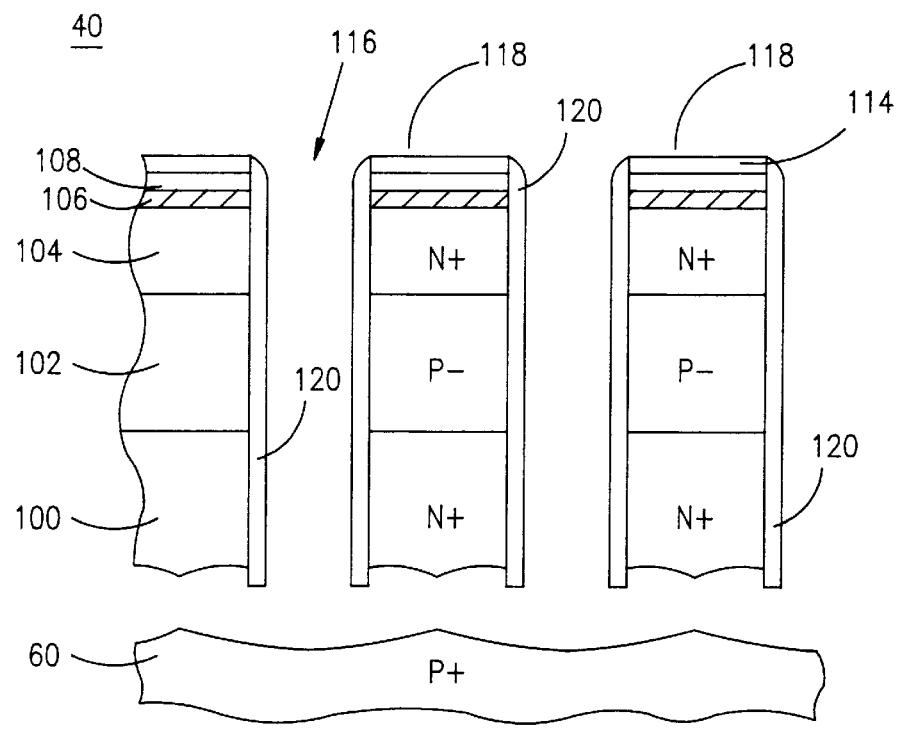
FIG. 9 shows the wafer of FIG. 3 at a processing step subsequent to that shown in FIG. 8.

After removal of the resist, the first set of trenches 110 is filled with silicon oxide by CVD or other suitable process to form a first set of silicon oxide bars 112, as shown in FIG. 6. The device array 40 is then planarized by any suitable means, such as chemical-mechanical polishing (CMP), stopping on the first nitride pad 108. A second nitride pad 114 is then deposited, preferably by CVD, to a thickness of about 60 to 100 nm. The device array 40 now appears as shown in FIG. 6.

FIG. 7 illustrates the next step in the process, in which a resist and mask (not shown) are applied, and photolithography is used to define a second set of trenches 116 orthogonal to the first set of silicon oxide bars 112. The nitride pads 108, 114, the oxide pad 106, and the exposed device layers 100, 102, 104 are etched out by a directional etching process such as RIE to define the second set of trenches 116. Etching is continued down to the level of the substrate 60, and the second set of trenches 116 should be approximately 0.95 microns deep. The resist is then removed. As can be seen, the second set of trenches 116 is defined by a set of device islands 118, which will be transformed into individual DRAM cells by the fabrication process described herein.

As shown in FIG. 8, a first nitride film 120 is now formed on the sides of the second set of trenches 116 by depositing a layer of CVD nitride and directionally etching to remove excess nitride from horizontal surfaces. The first nitride film 120, which is about 10 nm thick, acts as an oxidation and etching barrier during subsequent steps of the fabrication process. Isotropic etching such as RIE is then performed to deepen the second set of trenches 116 an additional 0.1 microns and undercut the device island resulting in the structure shown in FIG. 9.

Figure 10:
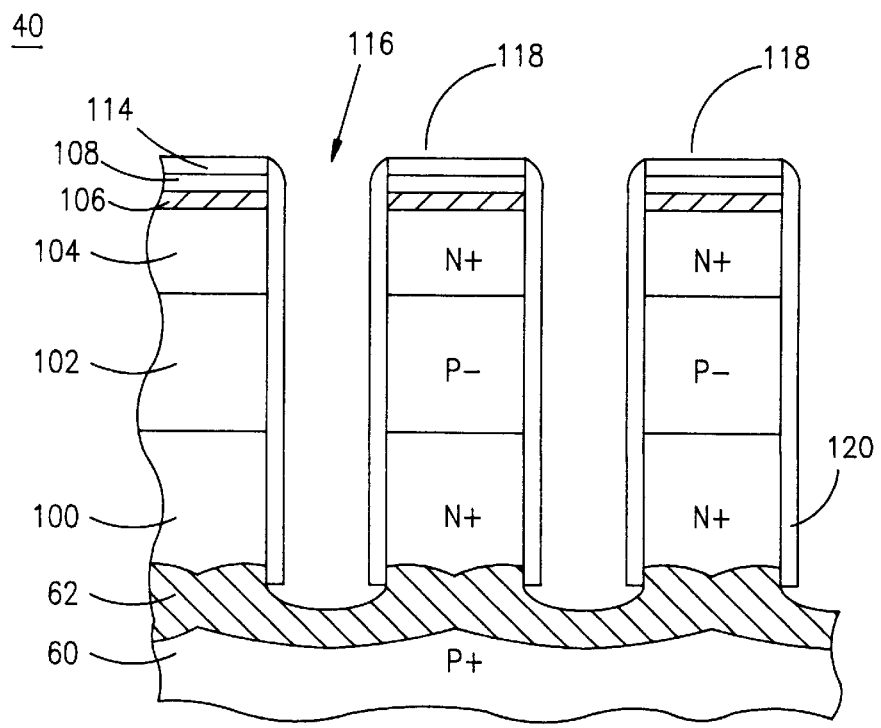
FIG. 10 shows the wafer of FIG. 3 at a processing step subsequent to that shown in FIG. 9.

Thermal oxidation is then performed to create an isolation layer 62 under and between the device islands 118, as depicted by FIG. 10. The substrate 60 is thermally oxidized by a suitable process as known in the art, such as by heating the wafer in a standard silicon processing furnace at a temperature of approximately 900 to 1100 degrees Celsius in a wet ambient. The oxidation time is selected to produce an isolation layer 62, at least approximately 0.1 microns thick under the device islands 118.

FIG. 11 shows the next step in the process, in which an anisotropic etch such as RIE is performed to deepen the second set of trenches 116 through the isolation layer 62 and into the substrate 60 to the depth desired for the trench capacitors.

Figure 13:
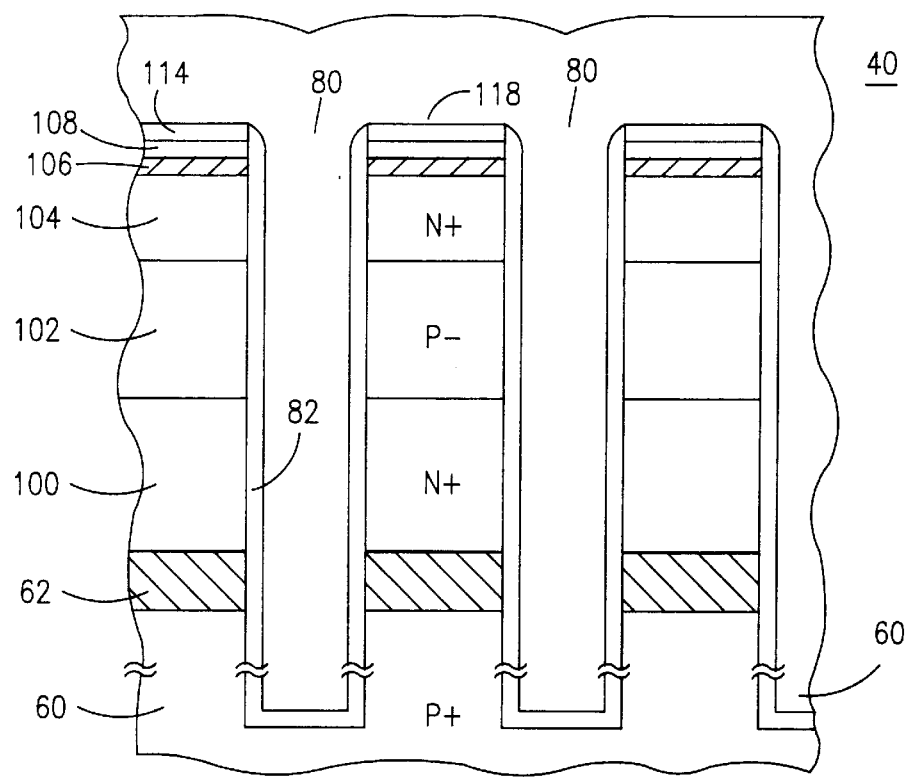
FIG. 13 shows the wafer of FIG. 3 at a processing step subsequent to that shown in FIG. 12.

As illustrated in FIG. 12, a capacitor dielectric layer 82 is now formed inside the second set of trenches 116 on the sides of the device islands 118 and the bottom of the trenches 116. The dielectric layer 82 may be oxide, ON, or ONO, and is preferably formed by CVD and/or thermal oxidation. Next, the second set of trenches 116 are filled with a polysilicon layer 80 of a second conductivity type (n+) by CVD or other suitable means, as shown in FIG. 13.

Figure 14:
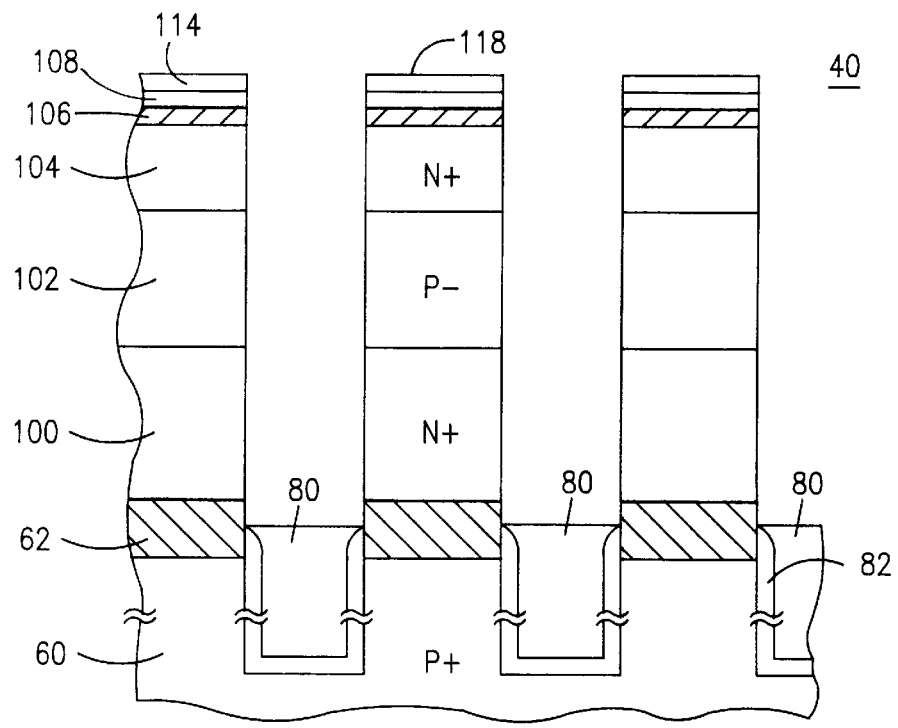
FIG. 14 shows the wafer of FIG. 3 at a processing step subsequent to that shown in FIG. 13.
Figure 15:
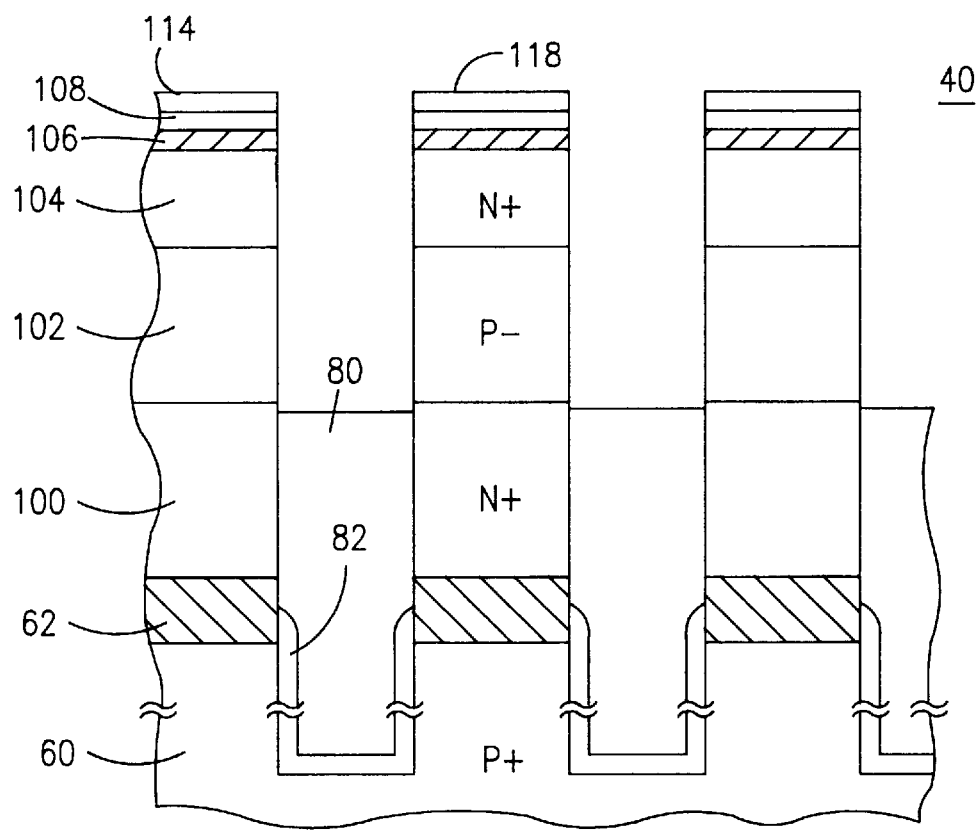
FIG. 15 shows the wafer of FIG. 3 at a processing step subsequent to that shown in FIG. 14.

The polysilicon layer 80 is then etched back to a level approximately 1 micron below the second nitride pad 114, as shown in FIG. 14. The capacitor dielectric on exposed sidewalls 82 is then removed by isotropic etching. The second set of trenches 116 are then re-filled with polysilicon of a second conductivity type (n+) by CVD. The polysilicon is then etched back to a level approximately 0.55 microns below the second nitride pad 114 to form a capacitor electrode 80, depicted in FIG. 15.

Figure 16:
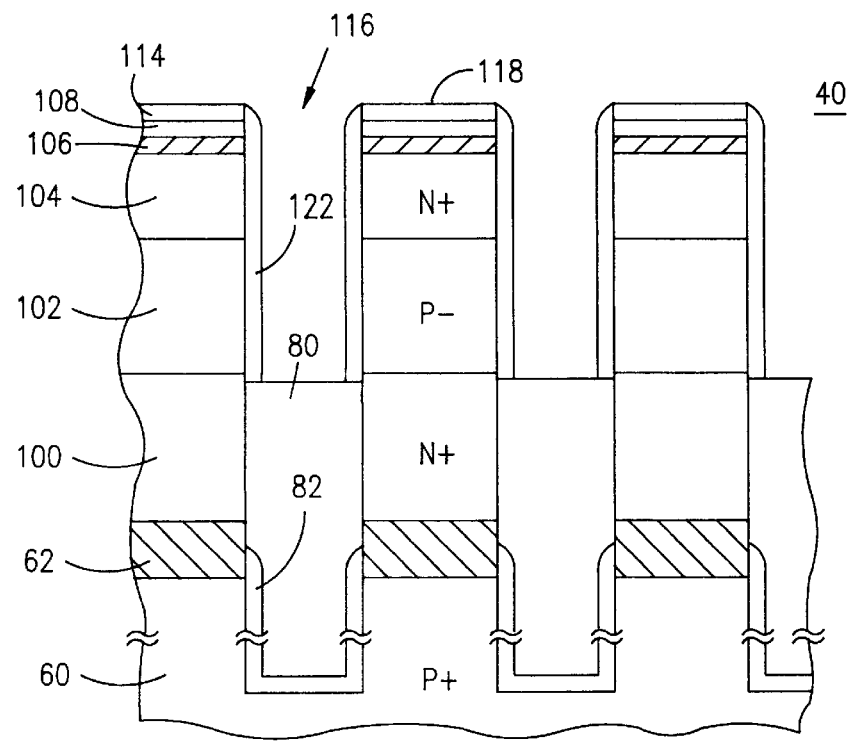
FIG. 16 shows the wafer of FIG. 3 at a processing step subsequent to that shown in FIG. 15.
Figure 17:
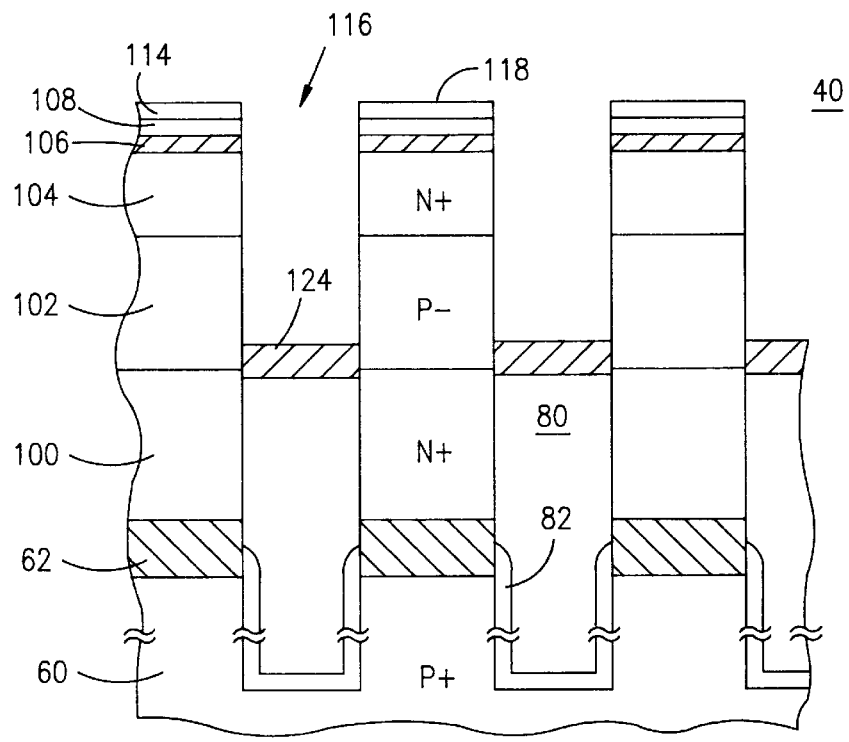
FIG. 17 shows the wafer of FIG. 3 at a processing step subsequent to that shown in FIG. 16.

FIG. 16 illustrates the next step of the process in which the exposed segments of oxide bars 112 are etched back by ~0.4 μm followed by the deposition of a nitride film 122 on the sides of the second set of trenches 116. The film 122, which is about 10 nm thick, is formed by depositing a layer of CVD nitride and directionally etching to remove excess nitride from horizontal surfaces. The second nitride film 122 acts as an oxidation barrier during the next step of the process.

Thermal oxidation of the capacitor electrode 80 is now performed by methods known in the art to create a first oxide layer 124 approximately 100 nm thick on top of the electrode 80 in the second set of trenches 116. The second nitride film 122 is then stripped from the sides of the device islands 118 and remaining segments of oxide 112 in trenches 116, preferably by isotropic etching with a nitride etchant such as phosphoric acid, to form the structure shown in FIG. 17.

Figure 18:
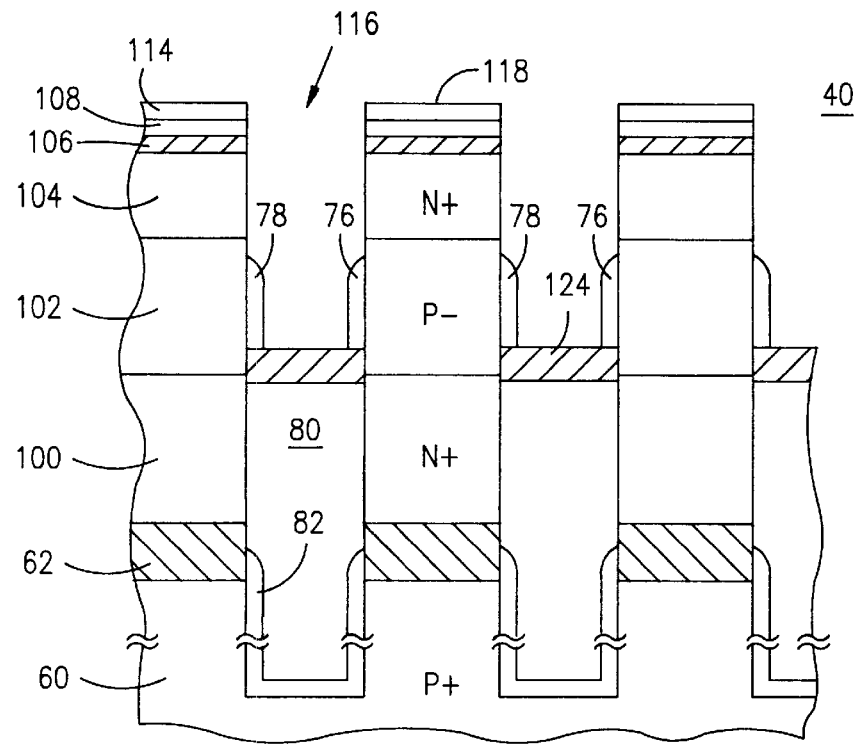
FIG. 18 shows the wafer of FIG. 3 at a processing step subsequent to that shown in FIG. 17.
Figure 19:
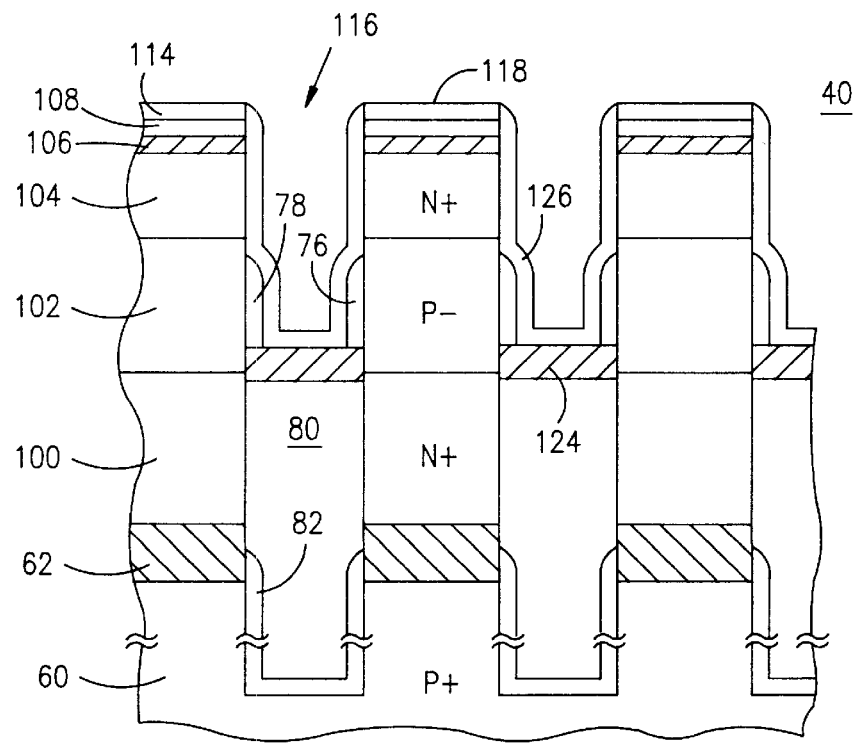
FIG. 19 shows the wafer of FIG. 3 at a processing step subsequent to that shown in FIG. 18.

FIG. 18 depicts the following step of the process where polysilicon of a first conductivity type (p+) is deposited by CVD or other suitable means in the second set of trenches 116 to a thickness of approximately 70 nm. A directional etch such as RIE is performed so that no polysilicon remains on the horizontal surfaces of the array 40, and the etch is continued to recess the top of the polysilicon to at least 0.2 microns below the bottom of the oxide pad 106. The resultant first and second body lines 76, 78 are shown in FIG. 18. A conformal film 126 of nitride or other suitable material is now formed over the first and second body lines 76, 78, as shown in FIG. 19. The conformal film 126 is approximately 10 nm thick, and is formed by CVD or other suitable methods.

Figure 20:
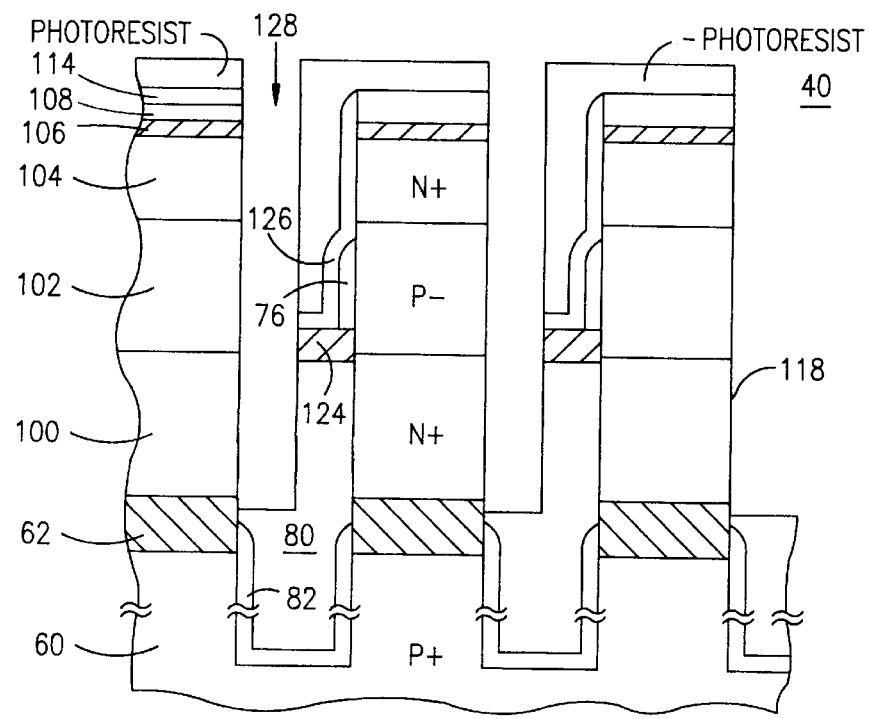
FIG. 20 shows the wafer of FIG. 3 at a processing step subsequent to that shown in FIG. 19.

As illustrated in FIG. 20, a photoresist and mask are applied, and photolithography is used to define a third set of trenches 128 inside the second set of trenches 116. The exposed conformal film 126 is etched off by an isotropic etch, and then a directional etch is performed to remove the second body line 78. Directional etching is continued to remove the exposed first oxide layer 124 and the exposed electrode 80 to a depth below the first device layer 100.

Figure 21:
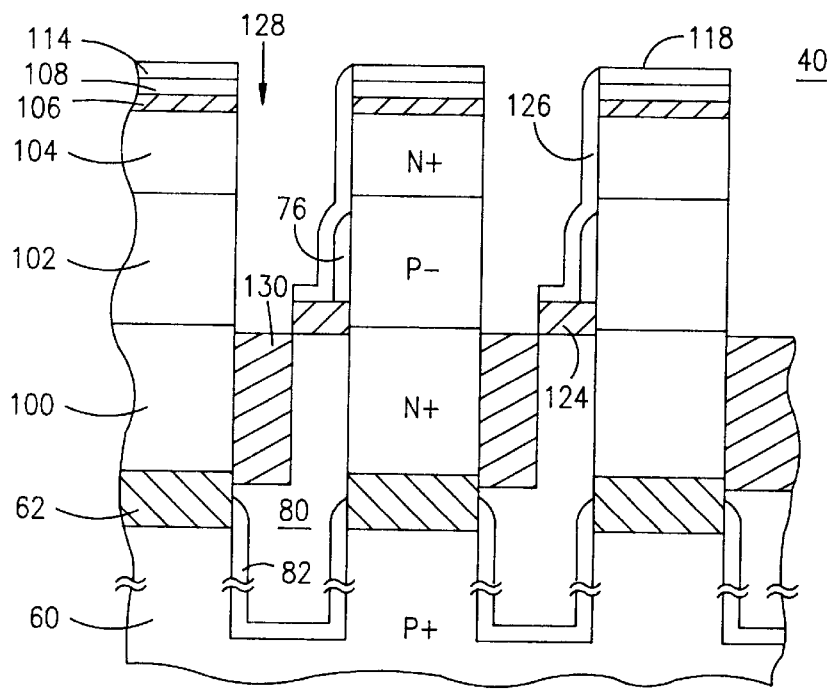
FIG. 21 shows the wafer of FIG. 3 at a processing step subsequent to that shown in FIG. 20.

The resist is stripped, and the third set of trenches is filled with silicon oxide by CVD or known methods, as shown in FIG. 21. If desired, the device array 40 may be planarized by CMP or other means at this point. The silicon oxide is then etched back to form a second oxide layer 130 at a level approximately 0.6 to 0.7 microns below the level of the oxide pad 106.

Figure 22:
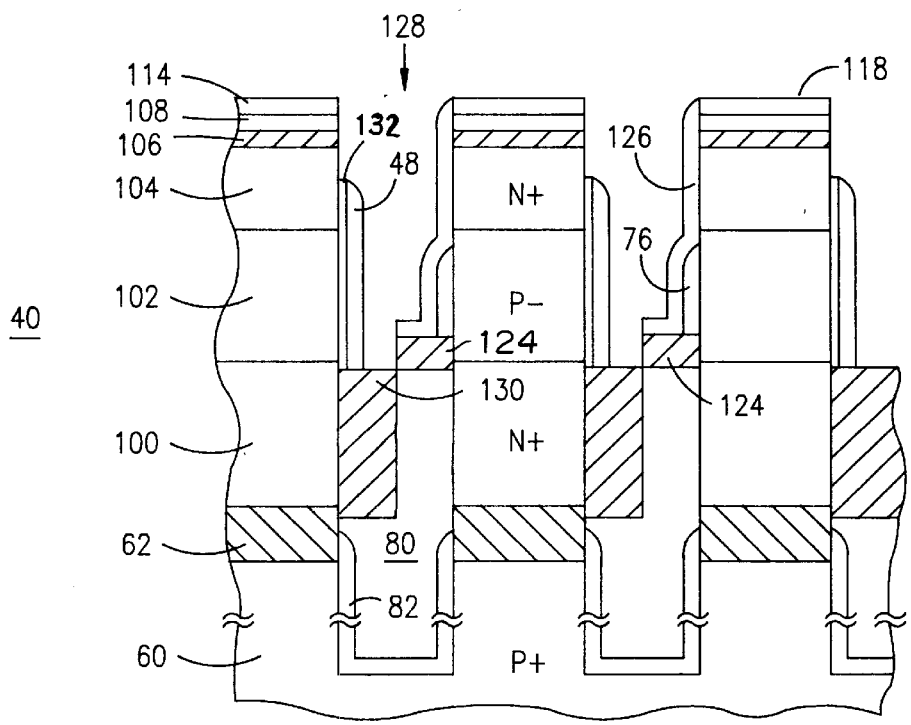
FIG. 22 shows the wafer of FIG. 3 at a processing step subsequent to that shown in FIG. 21.

FIG. 22 depicts the next step, in which a thin gate oxide layer 132 is formed by thermal oxidation of the exposed side of the device islands 118. Next, polysilicon of a second conductivity type (n+) is deposited by CVD or other suitable means in the third set of trenches 128 to a thickness of approximately 70 nm. A directional etch such as RIE is performed so that no polysilicon remains on the horizontal surfaces of the array 40. A resist and mask (not shown) are then applied, and a selective etch is performed to remove excess polysilicon on the body line 76 side of the third set of trenches 128. The resultant word line 48 is shown in FIG. 22.

Figure 23:
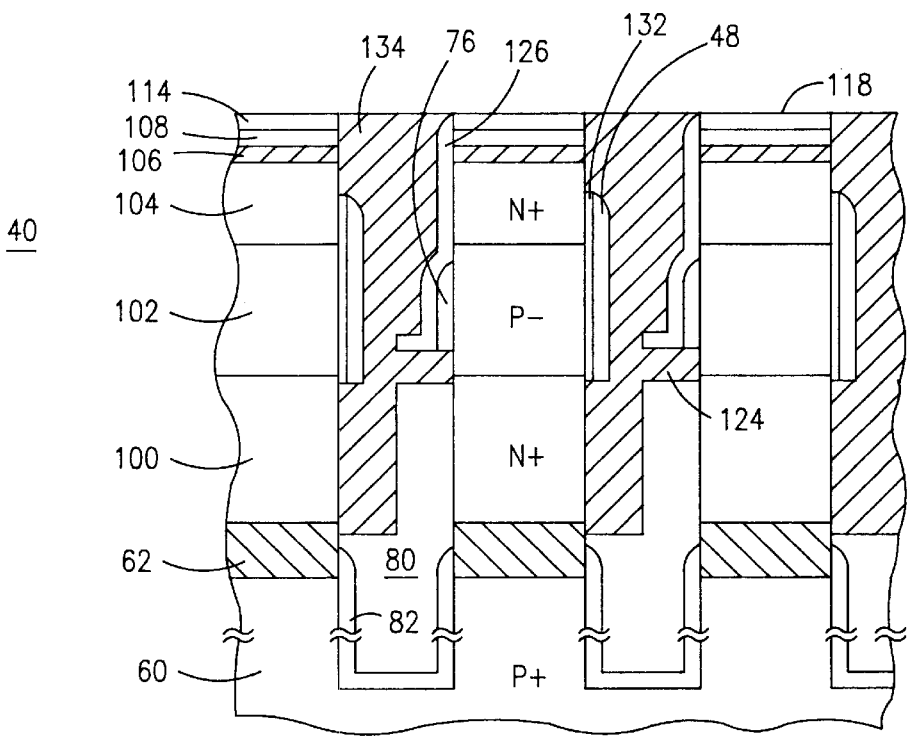
FIG. 23 shows the wafer of FIG. 3 at a processing step subsequent to that shown in FIG. 22.
Figure 24:
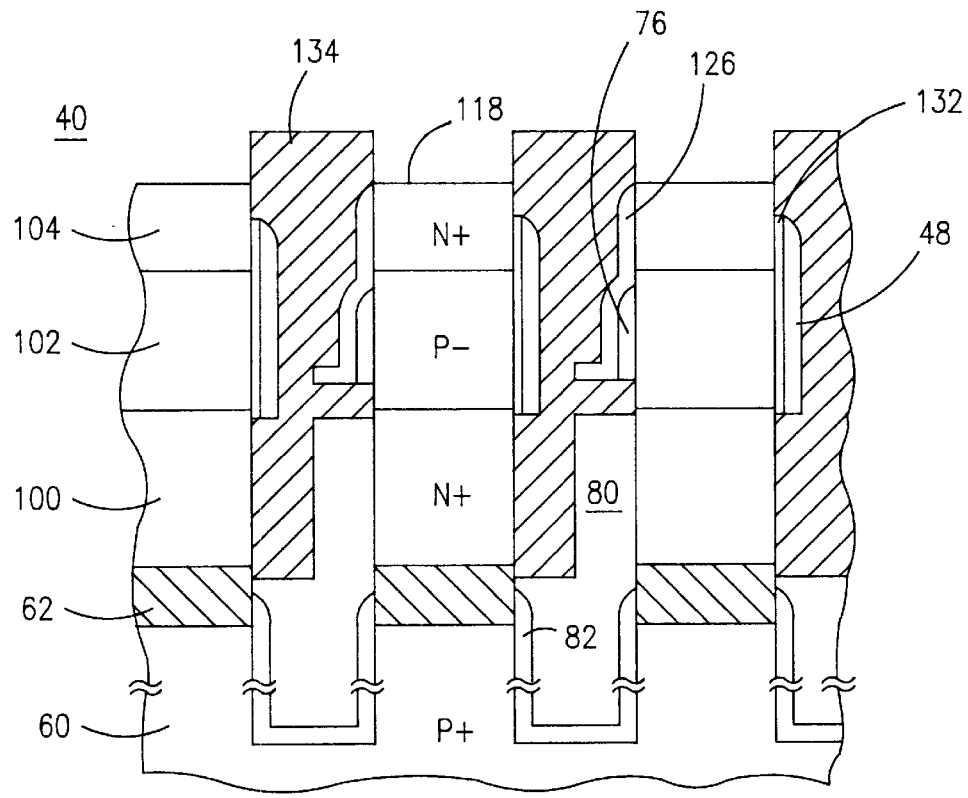
FIG. 24 shows the wafer of FIG. 3 at a processing step subsequent to that shown in FIG. 23.

The resist is stripped, and the third set of trenches 128 are filled with silicon oxide by CVD or other suitable means to form a second set of silicon oxide bars 134, as shown in FIG. 23. The device array 40 is then planarized by any suitable means, such as CMP, stopping on the second nitride pad 114. FIG. 24 illustrates the next step in the process, in which a dip etch is performed to remove the nitride pads 108, 114 and the oxide pad 106 from the device islands 118.

Figure 25:
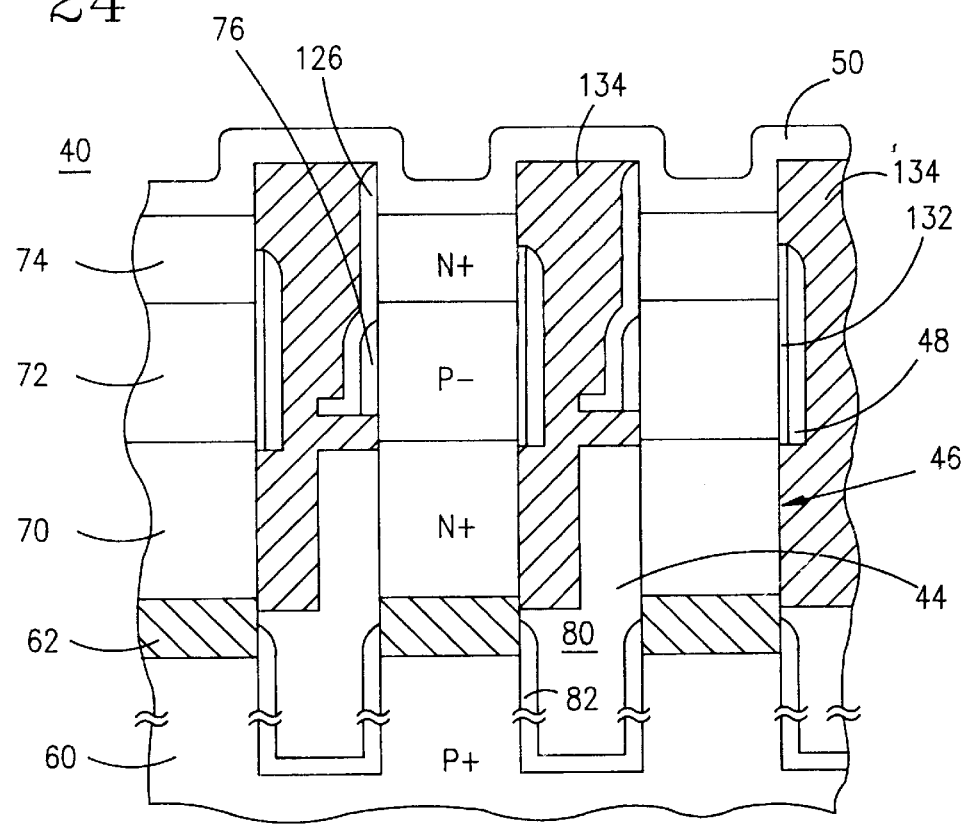
FIG. 25 shows the wafer of FIG. 3 at a processing step subsequent to that shown in FIG. 24.

As shown in FIG. 25, the next step is to form a conductive bit line 50 over the device array 40 so that it contacts the source 74 of each transistor 46 of a particular row in the array 40. The bit line 50 is formed of doped polysilicon of a second conductivity type (n+), and is deposited by means such as CVD. After deposition, the polysilicon is patterned by photolithography and subsequent etching to form a bit line 50 as shown in FIG. 25 and in FIG. 2. Conventional processing methods may then be used to form contacts and wiring to connect the device array to peripheral circuits, and to form other connections. For example, the entire surface may then be covered with a passivation layer of, e.g., silicon dioxide, BSG, PSG, or BPSG, which is CMP planarized and etched to provide contact holes which may then be metallized. Conventional multiple layers of conductors and insulators may also be used to interconnect the structures.

As can be seen by the embodiments described herein, the present invention encompasses a trench DRAM cell having an area of $4F^2$ or smaller that comprises a vertical transistor located over a trench capacitor. As may be readily appreciated by persons skilled in the art, decreasing the size of the DRAM cell while maintaining common process steps with peripheral devices decreases fabrication costs while increasing array density. As a result, a high density and high performance array is produced by a simplified fabrication process.

The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. An integrated circuit memory cell comprising:
   a substrate;
   a trench capacitor formed in said substrate and having a conductive area and a first insulating layer between the conductive area and said substrate;
   a vertically stacked transistor having first, second and third stacked conductivity regions formed over said substrate, the second region being of a first conductivity type, and the first and third regions being of a second conductivity type, wherein the second region resides between said first and third regions, said vertically stacked transistor having a first vertical side and a second vertical side, wherein one of the vertical sides of the first stacked conductivity region is in contact with the conductive area of said trench capacitor;
   a second insulating layer between the first stacked conductivity region and said substrate;
   a third insulating layer positioned on one of the vertical sides of the second stacked conductivity region;
   a word line over said third insulating layer and positioned to form a gate of said transistor; and
   a bit line in contact with said third stacked conductivity region.

2. The memory cell of claim 1, wherein the cell is a dynamic random access memory cell.

3. The memory cell of claim 1, further comprising a body line positioned on the other vertical side of the second stacked conductivity region from the third insulating layer.

4. The memory cell of claim 3, wherein the body line is a doped polysilicon line.

5. The memory cell of claim 4, wherein the body line is doped to a first conductivity type.

6. The memory cell of claim 1, wherein the first, second, and third conductive regions are doped silicon regions.

7. The memory cell of claim 1, wherein the first conductivity type is p-type, and the second conductivity type is n-type.

8. The memory cell of claim 1, wherein the first conductivity type is n-type, and the second conductivity type is p-type.

9. The memory cell of claim 1, wherein the first insulating layer is a layer of oxide.

10. The memory cell of claim 1, wherein the first insulating layer is a layer of ON.

11. The memory cell of claim 1, wherein the first insulating layer is a layer of ONO.

12. The memory cell of claim 1, wherein said trench capacitor is formed in a trench on one of the vertical sides of said vertically stacked transistor.

13. The memory cell of claim 12, wherein the conductive area of said trench capacitor comprises a lower portion that extends across the entire width of the trench, and an upper portion that connects the lower portion to said vertically stacked transistor.

14. The memory cell of claim 12, wherein the trench is on the same vertical side of said vertically stacked transistor as the body line.

15. The memory cell of claim 12, wherein the trench is on a different vertical side of said vertically stacked transistor as the body line.

16. The memory cell of claim 1, wherein the word line is a doped polysilicon line.

17. The memory cell of claim 16, wherein the word line is doped to a second conductivity type.

18. The memory cell of claim 1, wherein the bit line is a doped polysilicon line.

19. The memory cell of claim 18, wherein the bit line is doped to a second conductivity type.

20. The memory cell of claim 1, wherein the memory cell has an area of approximately $4F^2$ or less, where F is the minimum lithographic feature size.

21. A DRAM cell comprising:
   a vertical transistor having a first doped silicon region formed on a substrate, a second doped silicon region formed on the first doped silicon region, and a third doped silicon region formed on the second doped silicon region;
   a trench capacitor located below said vertical transistor in the substrate and having a doped polysilicon electrode, wherein the electrode is in contact with the first doped silicon region;
   an insulating layer located between said vertical transistor and the substrate;
   a conductive line gating the second doped silicon region; and
   a bit line in contact with the third doped silicon region.

22. The DRAM cell of claim 21, wherein the substrate is doped to a first conductivity type, and the polysilicon electrode is doped to a second conductivity type.

23. The DRAM cell of claim 22, wherein the first and third doped silicon regions are doped to a second conductivity type, and the second doped silicon region is doped to a first conductivity type.

24. The DRAM cell of claim 21, wherein the first doped silicon region is the drain of said vertical transistor, the second doped silicon region is the body of said vertical transistor, and the third doped silicon region is the source of said vertical transistor.

25. The DRAM cell of claim 21, wherein said insulating layer is a layer of silicon dioxide.

26. The DRAM cell of claim 21, further comprising a body line in contact with the second doped silicon region.

27. The DRAM cell of claim 26, wherein the word line is doped to a second conductivity type, and the body line is doped to a first conductivity type.

28. The DRAM cell of claim 21, wherein the bit line is a doped polysilicon line of a second conductivity type.

29. The DRAM cell of claim 21, wherein the cell has an area of approximately $4F^2$ or less, where F is the minimum lithographic feature size.

30. A DRAM cell comprising:
a vertical transistor having a first doped silicon region formed on a substrate, a second doped silicon region formed on the first doped silicon region, and a third doped silicon region formed on the second doped silicon region, wherein the second doped silicon region is of a first conductivity type, and the first and third doped silicon regions are of a second conductivity type, wherein the vertical transistor has a first and a second vertical sides;
a trench capacitor located in a trench in the substrate on the first vertical side of said vertical transistor and having a doped polysilicon electrode of a second conductivity type, wherein the electrode is in contact with the first doped silicon region, and having a dielectric layer between the electrode and the substrate;
a first insulating layer located between said vertical transistor and the substrate;
a body line of a first conductivity type in contact with the second doped silicon region on the first vertical side of said vertical transistor;
a conductive line of a second conductivity type gating the second doped silicon region on the second vertical side of said vertical transistor, wherein a second insulating layer lies between the conductive line and the second doped silicon region; and
a bit line of a second conductivity type in contact with the third doped silicon region.

31. A semiconductor memory array comprising:
a substrate;
a plurality of memory cells arranged into an array of rows and columns, wherein each memory cell comprises a trench capacitor located in the substrate and a vertical transistor having first, second and third regions located above the trench capacitor, wherein the first region of the vertical transistor adjoins the trench capacitor, each memory cell having an area of $4F^2$ where F is the minimum lithographic feature size;
a plurality of bit lines, wherein each bit line is in contact with the third region of each vertical transistor in a respective column; and
a plurality of buried word lines, wherein each word line adjoins the second region of each vertical transistor in a respective row, and is separated from the second region by an insulating layer.

32. The memory array of claim 31, wherein the substrate is a silicon substrate.

33. The memory array of claim 32, wherein the substrate is doped to a first conductivity type.

34. The memory array of claim 33, wherein the trench capacitor of each memory cell is located in a trench on one side of the vertical transistor.

35. The memory array of claim 34, wherein the trench capacitor further comprises a doped polysilicon electrode of a second conductivity type having a lower portion that extends across the entire width of the trench, and an upper portion that connects the lower portion to the vertical transistor.

36. The memory array of claim 35, wherein the trench capacitor further comprises a dielectric layer located between the lower portion of the electrode and the walls and bottom of the trench.

37. The memory array of claim 36, wherein the dielectric layer is a layer of material selected from the group consisting of oxide, ON, ONO and other suitable dielectric material.

38. The memory array of claim 31, wherein the trench capacitor has an area of approximately $1F^2$, where F is the minimum lithographic feature size.

39. The memory array of claim 31, wherein the vertical transistor has an area of approximately $1F^2$, where F is the minimum lithographic feature size.

40. The memory array of claim 31, wherein the first, second and third regions of the vertical transistor are doped silicon regions, wherein the first and the third regions are doped to a second conductivity type, and the second region is doped to a first conductivity type.

41. The memory array of claim 40, wherein the plurality of bit lines are doped polysilicon lines of a second conductivity type, and the plurality of buried word lines are doped polysilicon lines of a second conductivity type.

42. The memory array of claim 31, further comprising a plurality of buried body lines, wherein each body line is in contact with the second region of each vertical transistor in a respective column.

* * * * *

UNITED STATES PATENT AND TRADEMARK OFFICE
CERTIFICATE OF CORRECTION

PATENT NO. : 5,977,579

DATED : November 30, 1999

INVENTOR(S) : Wendell Noble

It is certified that errors appear in the above-identified patent and that said Letters Patent is hereby corrected as shown below:

Title page in the Abstract, line 3, change "arrays" to --array--.

Column 4, line 21, change "th e" to --the--.

Column 4, line 38, change "an y" to --any--.

Signed and Sealed this

Twenty-third Day of May, 2000

*Attest:*

Q. TODD DICKINSON

*Attesting Officer*     *Director of Patents and Trademarks*